(12) United States Patent
Sellers et al.

(10) Patent No.: US 7,053,470 B1
(45) Date of Patent: May 30, 2006

(54) MULTI-CHIP PACKAGE HAVING REPAIRABLE EMBEDDED MEMORIES ON A SYSTEM CHIP WITH AN EEPROM CHIP STORING REPAIR INFORMATION

(75) Inventors: Scott D. Sellers, Menlo Park, CA (US); Elias Atmeh, San Jose, CA (US)

(73) Assignee: Azul Systems, Inc., Mountain View, CA (US)

( * ) Notice: Subject to any disclaimer, the term of this patent is extended or adjusted under 35 U.S.C. 154(b) by 0 days.

(21) Appl. No.: 10/906,438

(22) Filed: Feb. 19, 2005

(51) Int. Cl.
*H01L 23/02* (2006.01)

(52) U.S. Cl. ............... 257/678; 257/723; 438/108; 365/185.09; 714/30; 714/738

(58) Field of Classification Search ............ 257/723, 257/724–725, 773; 438/106–108; 365/125, 365/200; 714/30, 33, 718
See application file for complete search history.

(56) References Cited

U.S. PATENT DOCUMENTS

| | | | | |
|---|---|---|---|---|
| 5,058,071 | A | * | 10/1991 | Kohda et al. ......... 365/185.09 |
| 5,608,342 | A |   | 3/1997 | Trimberger ............... 326/28 |
| 5,764,574 | A |   | 6/1998 | Nevill et al. .............. 365/200 |
| 5,959,909 | A |   | 9/1999 | Peng et al. ............... 365/200 |
| 5,963,464 | A |   | 10/1999 | Dell et al. ................. 365/52 |
| 6,008,538 | A | * | 12/1999 | Akram et al. ............. 257/723 |
| 6,060,339 | A | * | 5/2000 | Akram et al. ............. 438/108 |
| 6,178,549 | B1 |  | 1/2001 | Lin et al. .................. 717/124 |
| 6,384,630 | B1 |  | 5/2002 | Cliff et al. .................. 326/41 |
| 6,531,339 | B1 |  | 3/2003 | King et al. ................ 438/110 |
| 6,574,763 | B1 | * | 6/2003 | Bertin et al. ............... 714/738 |
| 6,865,694 | B1 | * | 3/2005 | Schutt et al. ................ 714/30 |
| 2002/0154553 | A1 | | 10/2002 | Shubat et al. ............. 365/200 |
| 2003/0023914 | A1 | | 1/2003 | Taylor et al. .............. 714/733 |
| 2003/0204782 | A1 | | 10/2003 | Schutt et al. ................ 714/30 |

\* cited by examiner

*Primary Examiner*—Ngân V. Ngô
*Assistant Examiner*—Tram H. Nguyen
(74) *Attorney, Agent, or Firm*—Stuart T. Auvinen (57) ABSTRACT

A die with embedded memory is packaged together in a same dual-chip package with an EEPROM die. Defects in the embedded memory can be repaired using redundant rows or columns. A built-in self-test (BIST) controller locates defects and a repair image is generated. The repair image is stored in non-volatile memory in the EEPROM die. At power-up, the repair image is copied from the EEPROM die to a volatile repair RAM in the embedded memory die. The redundant rows or columns are mapped to replace defective rows/columns using the repair image in the volatile repair RAM. Although the embedded-memory die has only volatile memory and no fuses, its embedded memory can be repaired using the repair map from the non-volatile EEPROM die. Since the EEPROM die is in the same dual-chip package as the embedded memory die, the repair map is always available.

17 Claims, 10 Drawing Sheets

PRIOR ART

WAFER SORT

MULTI-CHIP PACKAGE HAVING REPAIRABLE EMBEDDED MEMORIES ON A SYSTEM CHIP WITH AN EEPROM CHIP STORING REPAIR INFORMATION

FIELD OF THE INVENTION

This invention relates to redundant memories, and more particularly to repairable embedded memories packaged in a multi-chip package.

BACKGROUND OF THE INVENTON

Processing improvements have allowed for much more logic, memory, and other functions to be integrated together on a single silicon die. Such very-large-scale-integration (VLSI) chips may have millions of transistors on a single die. Many arrays of memories can be integrated together with areas of logic.

Testing such large integrated circuits (ICs) can be difficult. The memory array may be deeply embedded within the surrounding logic, with no direct path from the embedded memory to the chip's I/O pins. The surrounding logic may be sequential, requiring long sequences of inputs to write and read memory locations. When defects occur, it may be difficult to isolate them. Some defects may not be readily visible to an external tester. Special testing logic may be added to allow direct access of the embedded memory by an external tester.

Large semiconductor memories often include redundancy to improve manufacturing yields. When a defect is found in a memory location, a redundant memory location is used rather than the defective location. Typically an entire row or an entire column is replaced when a defect is found. Decoding and muxing logic around the memory cells can be programmed to route data to the redundant row or column to avoid the faulty memory location.

Figure 1:
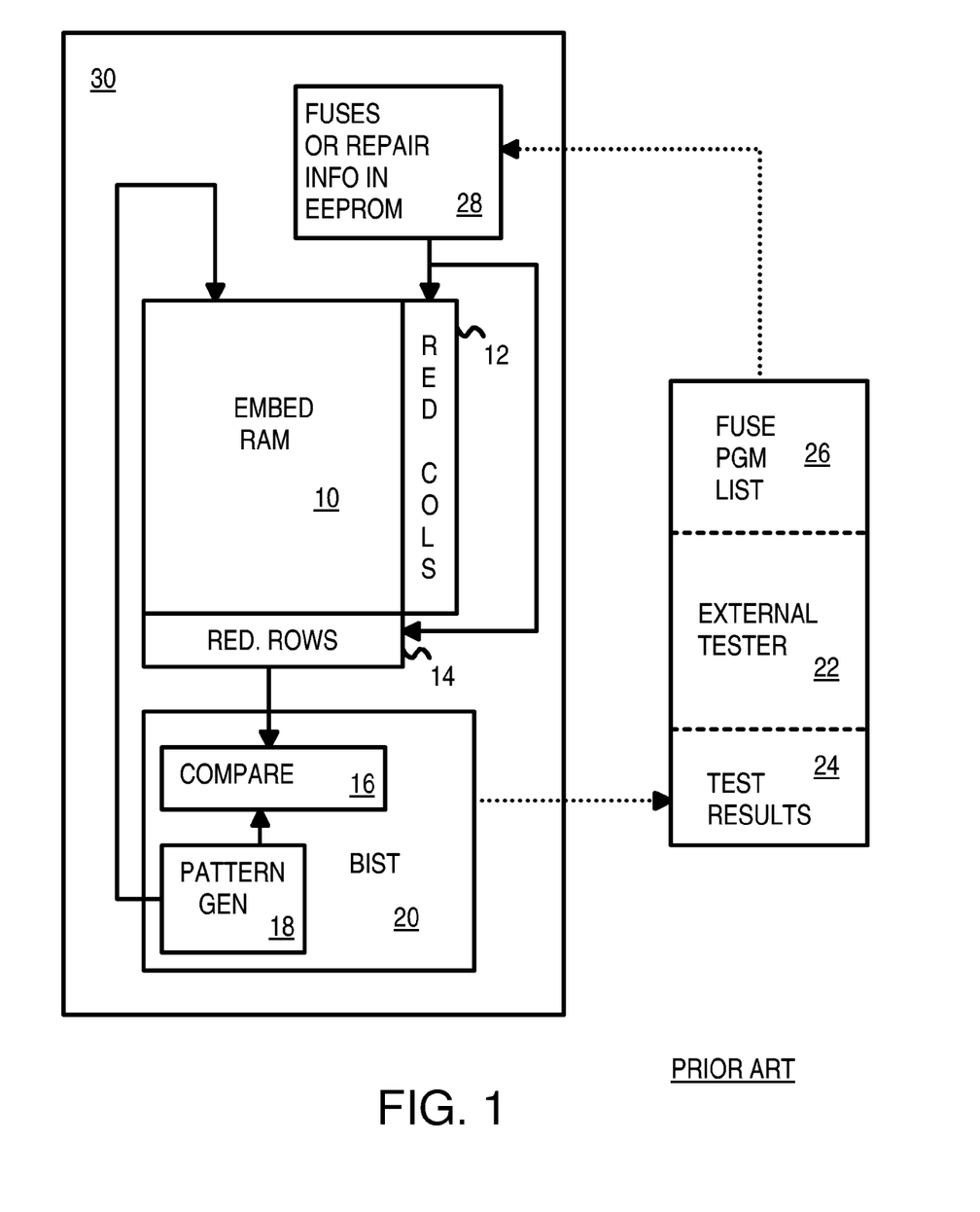
FIG. 1 shows an embedded memory with built-in self-test (BIST).

FIG. 1 shows an embedded memory with built-in self-test (BIST). Chip 30 has embedded memory array 10 that is surrounded by logic (not shown) on chip 30. Row and column decoders around embedded memory array 10 allow for random access of memory locations in response to an address. BIST 20 generates addresses to embedded memory array 10 and also has pattern generator 18 that generates data to write to embedded memory array 10. The generated data and addresses from BIST 20 are written into embedded memory array 10 during a first pass in a test mode. BIST 20 can also re-generate the addresses and read back the data from embedded memory array 10 in a second pass of the test mode, using comparator 16 to compare the data read back from embedded memory array 10 to data re-generated by pattern generator 18 in the second pass.

When comparator 16 detects a data mis-match, an faulty memory location is detected. The address of the faulty memory location can be sent off-chip from BIST 20 to external tester 22 as test results 24. External tester 22 can then analyze all faulty memory locations in test results 24 to determine if repair is possible. A list of fuses to program can be generated by external tester 22 as fuse list 26, which can be sent to a fuse programmer to program fuses on chip 30. The programmed fuses cause redundant rows 14 and/or redundant columns 12 to be used rather than rows or columns with defective memory locations.

A variety of fuse technologies may be used. For example, fuses may be small conducting links that are heated by a high current to break the links, or may be links that are targeted by a laser to open the links. Fuses may also be electrically-programmable read-only memory, EPROM, or electrically-erasable programmable read-only memory, EEPROM, or other flash transistors acting as e-fuses. In some embodiments, chip 30 may be constructed from an EEPROM process, so such EEPROM transistors are readily available. Repair information from external tester 22 can be stored in a non-volatile EEPROM memory as fuses 28, rather than use blowable fuses as fuses 28 that control use of redundant rows 14 and/or redundant columns 12.

However, EEPROM transistors require special semiconductor manufacturing processes. Many chips do not need EEPROM transistors, so adding EEPROM transistors for storing fuse or redundancy information adds processing expense. Fuses may also require additional processing steps and thus increase processing costs. High-current programming logic can add to the area and cost of chip 30, while external laser-programmer machines are expensive to use and may require large-area fuses as targets, increasing die costs.

Many memory defects may be present for larger embedded memory arrays. The test results and repair map may be somewhat large, requiring a repair-map memory size of more than just a few bytes. This can increase manufacturing and fuse-programming costs. The repair information may be compressed somewhat, but complex decoding and repair logic may be needed for decoding the compressed information. Compressing the repair information may reduce repair effectiveness.

What is desired is a repairable embedded memory with redundant elements that does not require fuses, e-fuses, or non-volatile transistors to control the use of the redundant elements. An embedded memory that is repairable with only non-volatile on-chip repair memory is desirable.

DETAILED DESCRIPTION

The present invention relates to an improvement in repairable embedded memories. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that including e-fuses or EEPROM transistors on the same silicon chip as an embedded memory is expensive and thus undesirable. However, serial flash-memory chips with EEPROM transistors are readily available at low cost. The inventors realize that the repair information for the embedded memory may be stored on the serial flash-memory chip. However, keeping the serial flash-memory chip programmed with the repair information and the embedded-memory chip together is problematic, since they would be two different packaged chips. Installing the correct flash-memory chip with the corresponding embedded memory chip could be difficult, since if the wrong flash-memory chip were installed, with repair information for another embedded-memory chip, then the system would fail.

The inventors have realized that keeping the corresponding flash-memory and embedded-memory chips together would be the primary manufacturing problem. The inventors solve this problem by packaging the flash-memory chip together with the embedded-memory chip in a multi-chip package, before programming the flash-memory chip. Thus the correct repair information is always kept in the same package with the embedded memory chip.

Figure 2:
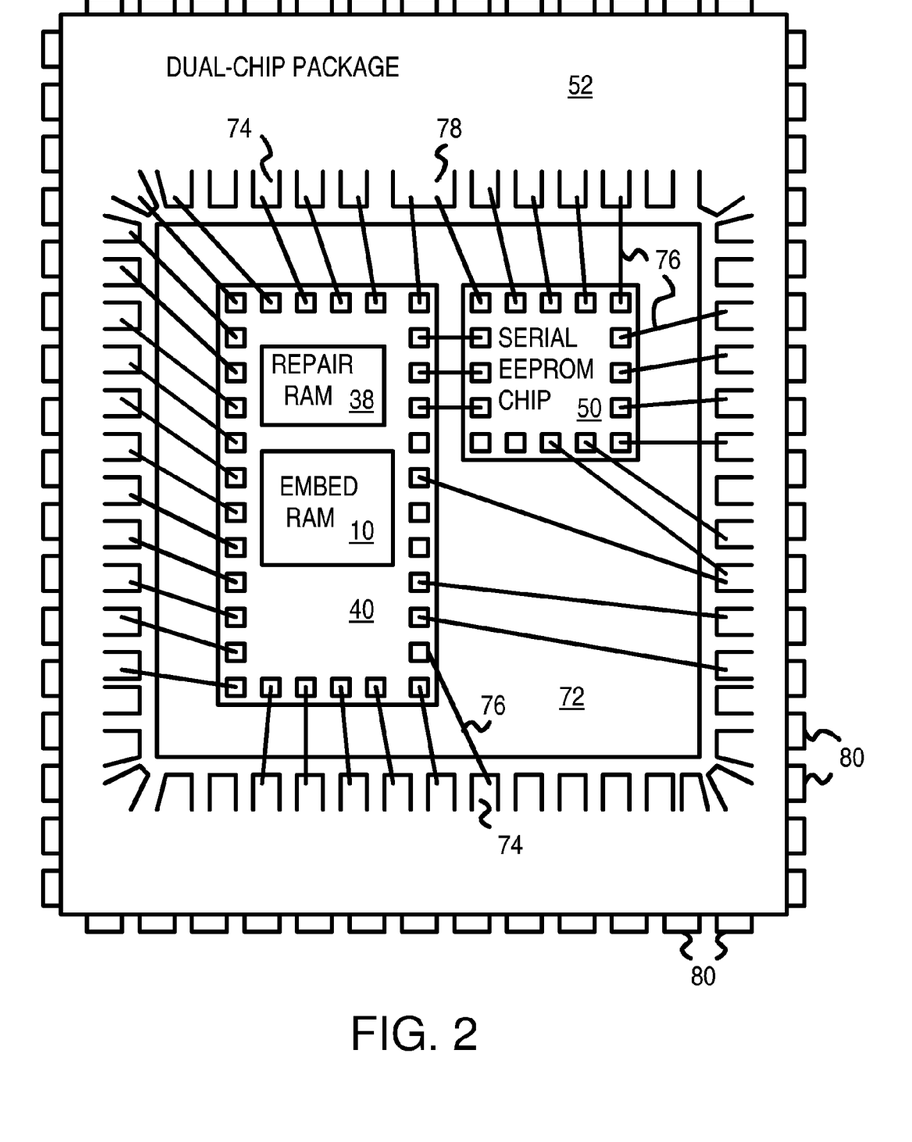
FIG. 2 shows a multi-chip package containing a repairable embedded-memory chip and an EEPROM chip that stores repair information for the repairable embedded-memory chip.

FIG. 2 shows a multi-chip package containing a repairable embedded-memory chip and an EEPROM chip that stores repair information for the repairable embedded-memory chip. Dual-chip package 52 has large inner cavity 72 that two or more die can be attached to. Embedded memory die 40 and EEPROM die 50 are both attached to inner cavity 72, such as by adhesive applied to the flat bottoms of die 40, 50.

Surrounding inner cavity 72 are lead-frame extensions 74, 78, which are metal lead-frame fingers. Each lead-frame finger connects through dual-chip package 52 to one of external pins 80, which can be J-leads, flat pads, or other package pins.

After die 40, 50 are attached to inner cavity 72, bonding wires 76 are strung from bonding pads on die 40, 50 to lead-frame extensions 74, 78. In some embodiments, bonding wires 76 may be strung between a bonding pad on EEPROM die 50 directly to another bonding pad on embedded memory die 40 without bonding to one of lead-frame extensions 74, 78. However, this may not be possible on some processes. Two bonding wires 76, one from each of die 40, 50, may be attached to a shared lead-frame extension 78 to connect signals from die 40, 50. In still another embodiment, there are no shared lead-frame extensions 78. Only one of bonding wires 76 is attached to each lead-frame extension 78. Thus the two die may separately bond out to the bonding pads and package leads and not have any internal connection within the package. Multiple bonding wires 76 may still be attached to shared lead-frame extensions 78 for power and ground.

During testing, embedded memory array 10 is tested by BIST logic on embedded memory die 40, and a repair map is generated and stored into non-volatile memory on EEPROM die 50. Although all data is lost on embedded memory die 40 at power-down, the repair map stored on EEPROM die 50 is retained when power is lost. At each power-up, the repair information is copied from non-volatile memory on EEPROM die 50 to volatile repair RAM 38 on EEPROM die 50. The repair-map information from volatile repair RAM 38 is then used by redundancy-control logic embedded memory die 40 to map out defective memory locations with redundant rows and/or redundant columns.

Figure 3:
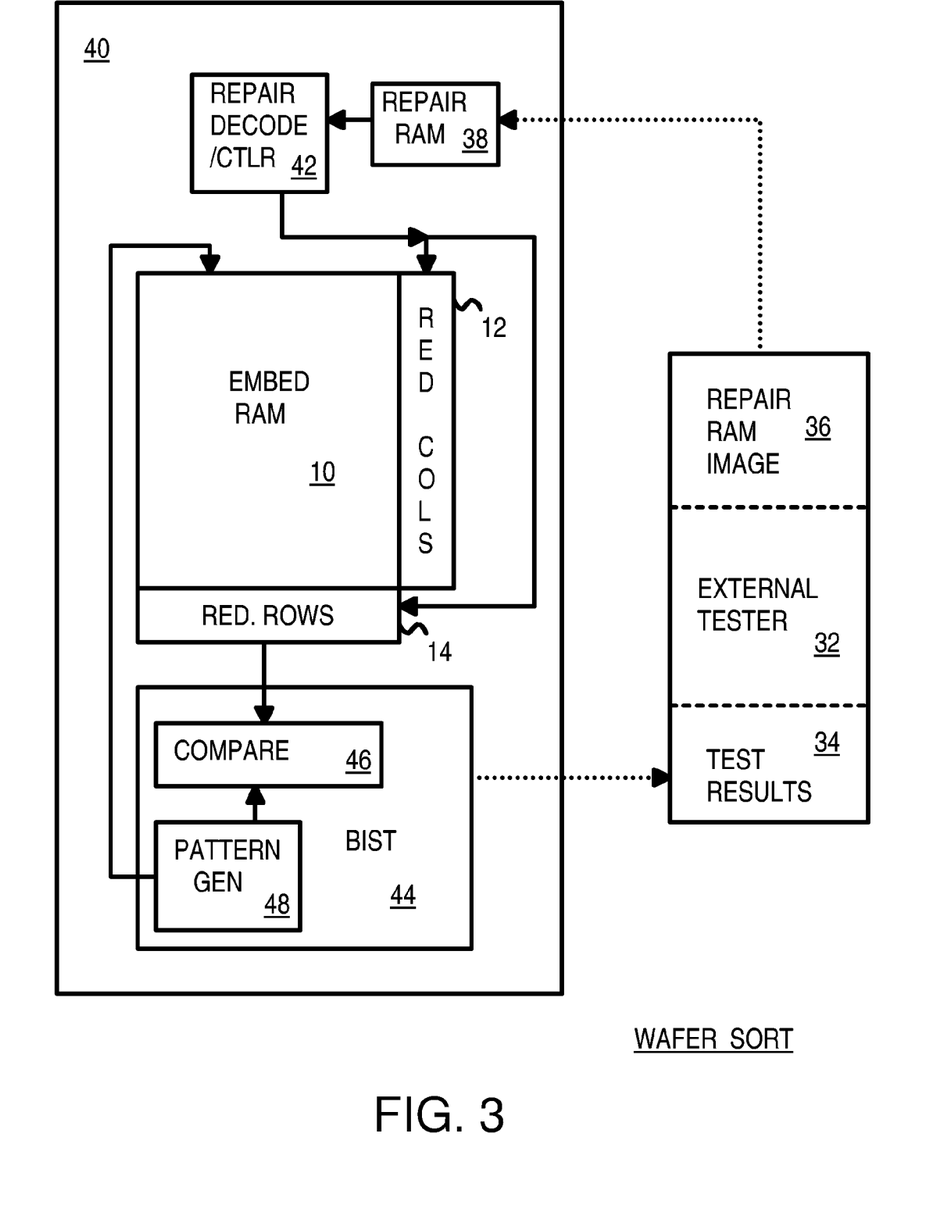
FIG. 3 illustrates testing of the embedded memory die at wafer sort.

FIG. 3 illustrates testing of the embedded memory die at wafer sort. Before embedded memory die 40 is separated from other die on a wafer, it must be tested to determine which dies (dice) are faulty (bad die) and which are functional (good die). Since embedded memory die 40 lacks non-volatile memory, the repair information is lost when power is removed.

Each die on the wafer is tested in succession using probe cards that have pins that are lowered onto bonding pads (or bumps for flip-chip packaging) on each die during testing. Power and ground and input stimuli are applied through the probe card and outputs are sensed. After basic continuity, power drain, and other D.C. tests are passed, more complex functional tests are performed by applying sequences of inputs. A test mode can be entered to test embedded memory array 10.

Row and column decoders around embedded memory array 10 allow for random access of memory locations in response to an address during test mode. BIST 44 generates addresses to embedded memory array 10 and also has pattern generator 48 that generates data to write to embedded memory array 10. The generated data and addresses from BIST 44 are written into embedded memory array 10 during a first pass through a sequence of addresses in a test mode. BIST 44 can also re-generate the addresses in the sequence and read back the data from embedded memory array 10 in a second pass of the test mode, using comparator 46 to compare the data read back from embedded memory array 10 to data re-generated by pattern generator 48 in the second pass.

When comparator 46 detects a data mis-match, a faulty memory location is detected. The address of the faulty memory location can be sent off-chip from BIST 44 to external tester 32 as test results 34. External tester 32 can then analyze all faulty memory locations in test results 34 to determine if repair is possible.

When too many memory defects are found by BIST 44, then repair may be impossible. The die can be marked as a bad die, such as by inking with a black ink. Otherwise, external tester 32 determines which rows and/or which columns need to be repaired, and allocates redundant rows 14 and/or redundant columns 12 to replace the defective rows and/or columns. The allocation of redundant rows and columns is defined by repair image 36 that external tester 32 generates.

To verify that the repair can be successful, external tester 32 copies repair image 36 to volatile repair RAM 38 on embedded memory die 40. Repair controller 42 reads the repair image from volatile repair RAM 38 to determine which rows in embedded memory array 10 to replace with redundant rows 14. When redundant columns are also provided, repair controller 42 also determines which columns in embedded memory array 10 are replaced by redundant columns 12.

After repair controller 42 has activated redundant rows 14 and/or redundant columns 12, embedded memory array 10 can be tested again, perhaps using BIST 44 in a similar fashion as before. However, addresses that previously failed due to a faulty memory location in embedded memory array 10 are re-directed to memory locations in redundant rows 14 and/or redundant columns 12. Thus these failures should now pass.

Sometimes redundant rows 14 and/or redundant columns 12 may be defective, or the decoding logic or even repair controller 42 or volatile repair RAM 38 is defective. Then the attempted repair may fail. Further testing or repair attempts may be tried by external tester 32, perhaps using other locations in redundant rows 14 and/or redundant columns 12. Alternately, pre-testing of redundant rows 14 and/or redundant columns 12 or volatile repair RAM 38 may be performed before external tester 32 generates repair image 36. Then external tester 32 could avoid assigning defective redundant rows or columns, or could adjust repair image 36 to avoid faulty locations in volatile repair RAM 38.

BIST 44 may perform some of the functions of external tester 32, such as by generating repair image 36 on-chip. Then repair image 36 may be sent to external tester 32 rather than test results 34. BIST 44 could even send repair image 36 directly to volatile repair RAM 38, bypassing external tester 32.

Once wafer-sort testing of embedded memory die 40 is complete, power is removed and the repair image in volatile repair RAM 38 is lost. The wafer is sawed or scribed to separate the individual die from the wafer, and bad die are discarded. Good die, defined as die whose embedded memory is free of defects without requiring the use of the redundant memory elements, can be packaged in normal packages, while repairable die are packaged in dual-chip package 52 along with an un-programmed EEPROM die 50. Alternately, both good and repairable die could be packaged in the same type of package, dual-chip package 52. Good die can be distinguished from bad die by the color of ink applied, or number or absence of ink spots, or by external tester 32 remembering locations of good and bad die on the wafer.

Figure 4:
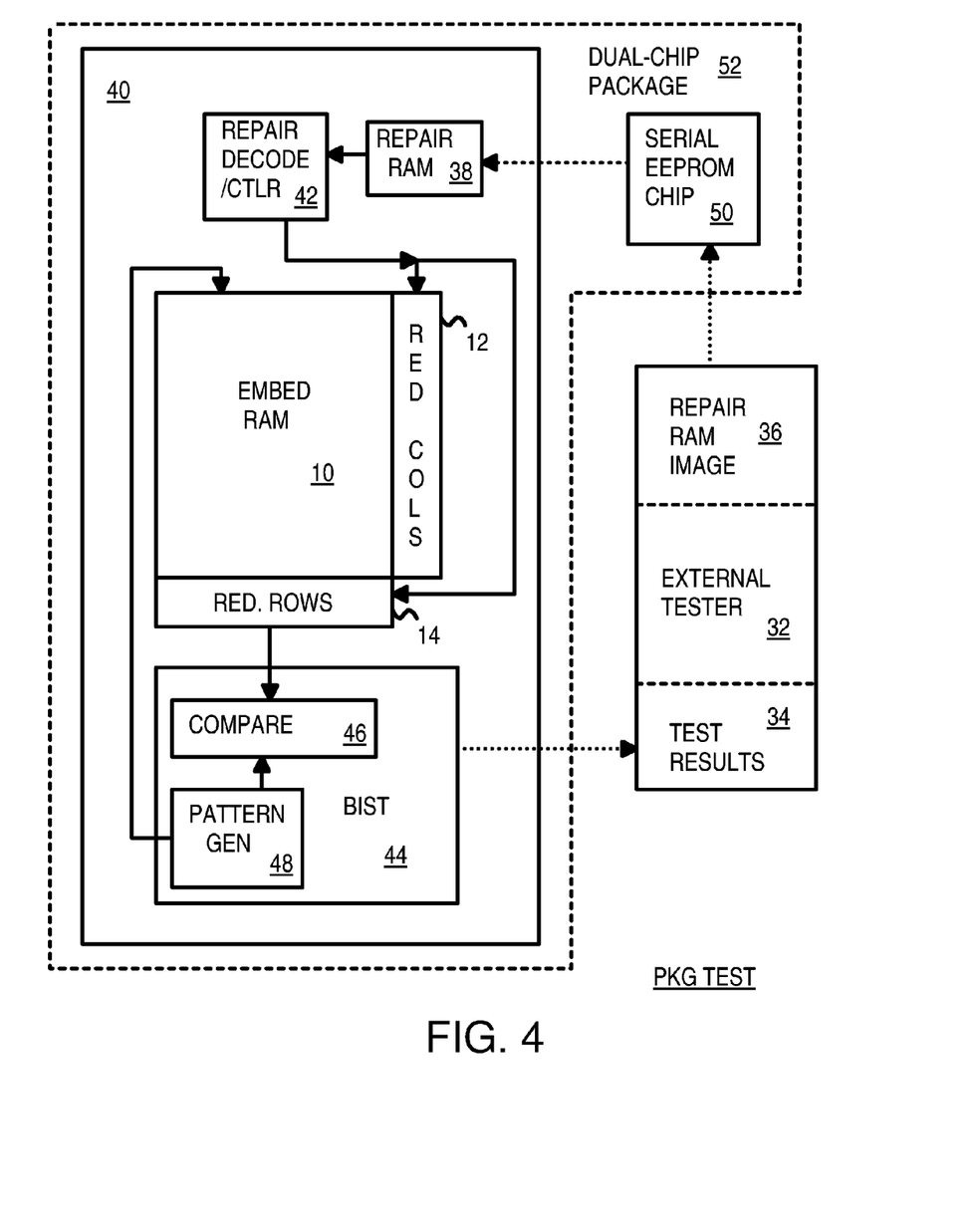
FIG. 4 illustrates testing of the embedded memory die packaged with the EEPROM die.

FIG. 4 illustrates testing of the embedded memory die packaged with the EEPROM die. Testing of packaged die is sometimes known as final test, although several tests may be performed on packaged die. More rigorous environmental testing may required repeating various tests at different temperatures or voltages, and with varying time periods.

After embedded memory die 40 is separated from other die on a wafer and packaged into dual-chip package 52 with EEPROM die 50, it must be tested to verify operation. EEPROM die 50 must also be programmed with repair image 36. Since EEPROM die 50 is a non-volatile memory, the repair information is retained within dual-chip package 52 when power is removed.

Repair image 36 generated by external tester 32 during wafer sort could be stored by external tester 32 for each repairable die, such as on a hard disk. However, then each repairable die must be tracked, such as with a serial number. Such tracking may be difficult. It may be easier to re-test embedded memory die 40 after packaging into dual-chip package 52, and to re-generate repair image 36 during final test.

During testing of dual-chip package 52, a test mode can be entered to test embedded memory array 10 on embedded memory die 40. Row and column decoders around embedded memory array 10 allow for random access of memory locations in response to an address during test mode. BIST 44 generates addresses to embedded memory array 10 and also has pattern generator 48 that generates data to write to embedded memory array 10. The generated data and addresses from BIST 44 are written into embedded memory array 10 during a first pass through a sequence of addresses in a test mode. BIST 44 can also re-generate the addresses in the sequence and read back the data from embedded memory array 10 in a second pass of the test mode, using comparator 46 to compare the data read back from embedded memory array 10 to data re-generated by pattern generator 48 in the second pass.

When comparator 46 detects a data mis-match, a faulty memory location is detected. The address of the faulty memory location can be sent off-chip from BIST 44 to external tester 32 as test results 34. External tester 32 can then analyze all faulty memory locations in test results 34 to verify that a repair is possible.

When too many memory defects are found by BIST 44, then repair may be impossible. The die may have been improperly marked and packaged, or damage may have occurred during packaging. The dual-chip package can be sorted into a failing bin and discarded. Some dual-chip packages may have no memory faults and can be sorted into a good bin.

For dual-chip packages containing embedded memory die 40 which has embedded memory array 10 which is repairable, external tester 32 determines which rows and/or which columns need to be repaired, and allocates redundant rows 14 and/or redundant columns 12 to replace the defective rows and/or columns. The allocation of redundant rows and columns is defined by repair image 36 that external tester 32 generates.

External tester 32 programs repair image 36 into EEPROM die 50 using a programming sequence. EEPROM die 50 may have a serial interface, requiring that repair image 36 be sent over a serial link. Before committing to programming of EEPROM die 50, external tester 32 may first verify that the repair can be successful, by directly copying repair image 36 to volatile repair RAM 38 on embedded memory die 40, bypassing EEPROM die 50. Then volatile repair RAM 38 can be used by repair controller 42 and BIST 44 to verify repair image 36 before programming into EEPROM die 50.

After pre-verification of repair image 36 is successful, external tester 32 programs repair image 36 into EEPROM die 50. If pre-verification fails, external tester 32 may try other repair images 36 and repeat pre-verification. Alternately, external tester 32 may skip such pre-verification of repair image 36 and directly program repair image 36 into EEPROM die 50.

After power-up, the copy of repair image 36 that is stored in EEPROM die 50 is copied from EEPROM die 50 to volatile repair RAM 38 in embedded memory die 40. Repair controller 42 reads the repair image from volatile repair RAM 38 to determine which rows in embedded memory array 10 to replace with redundant rows 14. When redundant columns are also provided, repair controller 42 also determines which columns in embedded memory array 10 are replaced by redundant columns 12.

After repair controller 42 has activated redundant rows 14 and/or redundant columns 12, embedded memory array 10 can be tested again, perhaps using BIST 44 in a similar fashion as before. However, addresses that previously failed due to a faulty memory location in embedded memory array 10 are re-directed to memory locations in redundant rows 14 and/or redundant columns 12. Thus these failures should now pass.

BIST 44 may perform some of the functions of external tester 32, such as by generating repair image 36 on-chip. Then repair image 36 may be programmed into EEPROM die 50 by external tester 32 without receiving test results 34.

Figure 5:
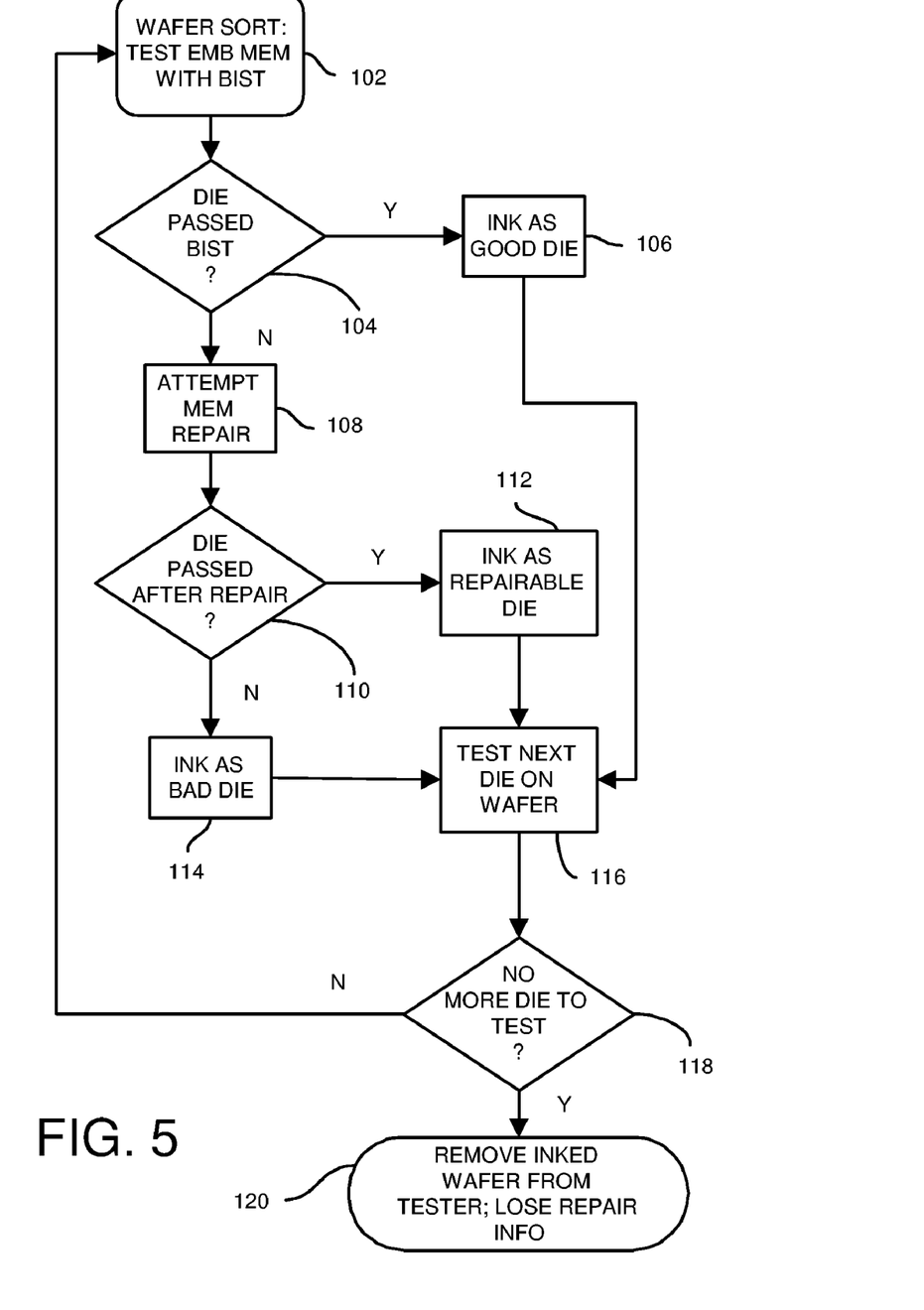
FIG. 5 is a flowchart of wafer-sort testing of embedded memory dice.

FIG. 5 is a flowchart of wafer-sort testing of embedded memory dice. The BIST is activated to test the embedded memory array on the die, step 102. If the die passed the BIST and other tests, step 104, the die is marked as a good die, step 106. Good die can be indicated by a lack of ink, or by ink color such as yellow. The wafer sort test probe card is moved over a new die and lowered to make contact with the bonding pads, step 116. When there are more die to test, step 118, then BIST is activated for the next die, step 102.

When the die fails the initial BIST, step 104, then repair is attempted, step 106. Redundant rows and/or redundant columns are mapped to replaced the faulty memory locations. This step may involve generating a repair image and copying it to volatile repair RAM 38 on embedded memory die 40.

When the embedded memory array still fails after repair is attempted one or more times, step 110, the die is inked as a bad die, step 114, and the probe card is moved to the next die for testing, step 116. Black ink or multiple ink spots can indicate a bad die, or a map of good and bad die locations can be kept and sent to a wafer saw and separate machine.

When the embedded memory array passes after repair is attempted one or more times, step 110, the die is inked as a repairable or good die, step 112, and the probe card is moved to the next die for testing, step 116. Repaired die may be marked the same as good die, or may be marked differently.

Once all die have been tested, step 118, then the wafer is removed from the wafer-sort tester. The repair information is lost since the embedded memory die does not have non-volatile memory for volatile repair RAM. The information could be stored persistently, such as on a hard drive, but this may complicate the manufacturing process significantly.

Figure 6:
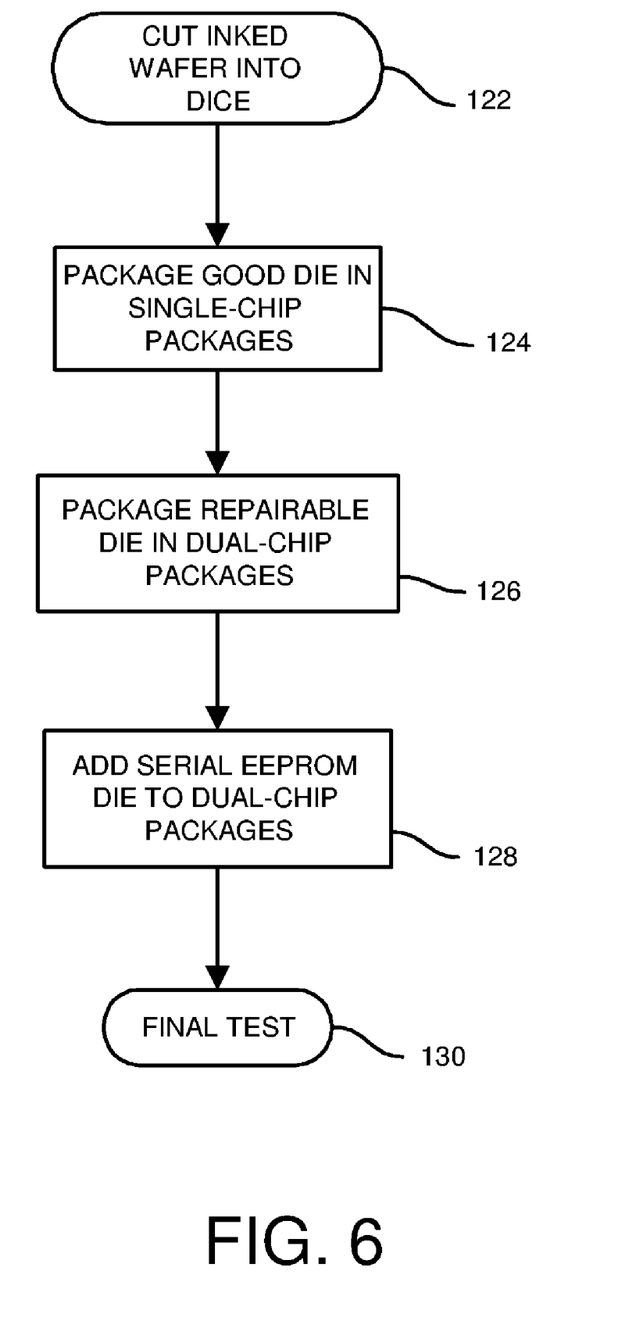
FIG. 6 is a flowchart of separation of dice from an inked wafer and packaging.

FIG. 6 is a flowchart of separation of dice from an inked wafer and packaging. The wafer is scribed, sawed, or otherwise processed to separate die from each other at their scribe lines, step 122. The good die may be packaged into single-chip packages, step 124. Alternately, good die may be processed the same as the repairable die, being packaged into the dual-chip package, step 126.

The EEPROM die are also placed into the same package cavity as the embedded memory die, step 126, for the repairable embedded memory die. Bonding wires are attached from both the embedded memory die and from the EEPROM die to the package lead frame, and the dice are sealed into the package such as by molding plastic or attaching a lid. The repairable die in the dual-chip packages can then proceed to final test, step 130.

Figure 7:
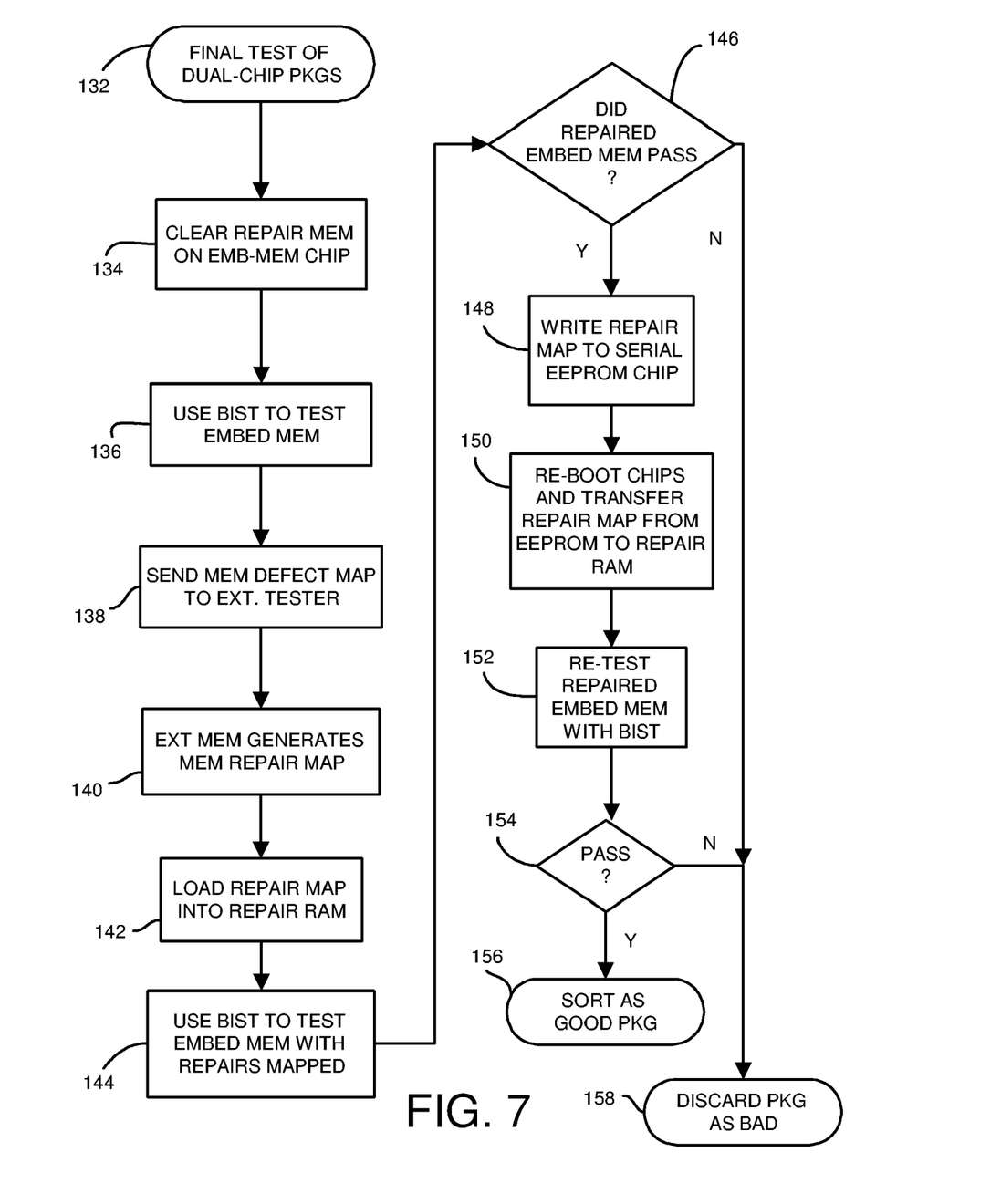
FIG. 7 is a flowchart of final testing of dual-chip packages.

FIG. 7 is a flowchart of final testing of dual-chip packages. Dual-chip packages are fed by a feeder to a tester, step 132. The volatile repair RAM loses its repair image data when power is off, such as when the dual-chip packages are transferred to the tester. The volatile repair RAM may default to pre-defined data, such as all zeros or all ones, when power is removed. Otherwise volatile repair RAM is cleared or set to a pre-defined state, step 134. This may also occur during testing of the volatile repair RAM on the embedded memory die before repair is attempted.

The BIST is activated to test the embedded memory array, step 136. Locations of memory defects are found by the BIST and sent to the external tester as test results, step 138. The external tester analyzes the defect locations to determine which redundant rows and/or redundant columns to use for repair. The external tester generates a repair image, step 140, to implement the repairs.

Alternately, BIST on embedded memory die may perform the analysis of the defects and generate the repair image directly. The repair image is copied into the volatile repair RAM, step 142. The repair controller decodes the repair image stored in the volatile repair RAM and re-maps addresses of defects to the redundant rows and/or redundant columns. The BIST then re-tests the repaired embedded memory array, step 144.

If the repaired embedded memory array fails the BIST, step 146, then the package can be sorted to the bad bin and discarded, step 158. When the package passes BIST, step 146, then the repair image can be programmed into the EEPROM die, step 148.

Power is cycled off and on again for the embedded memory die, or a reset input can be applied to the embedded memory die, step 150. As part of the initialization sequence, the embedded memory die reads the repair image from the EEPROM die and writes the repair image into the volatile repair RAM. The BIST re-tests the repaired embedded memory array, step 152, as part of its boot-up procedure.

If the repaired embedded memory array fails the initialization BIST, step 154, then the package can be sorted to the bad bin and discarded, step 158. When the package passes the initialization BIST, step 154, the dual-chip package can be sorted into the good bin and sold as a good device.

Figure 8:
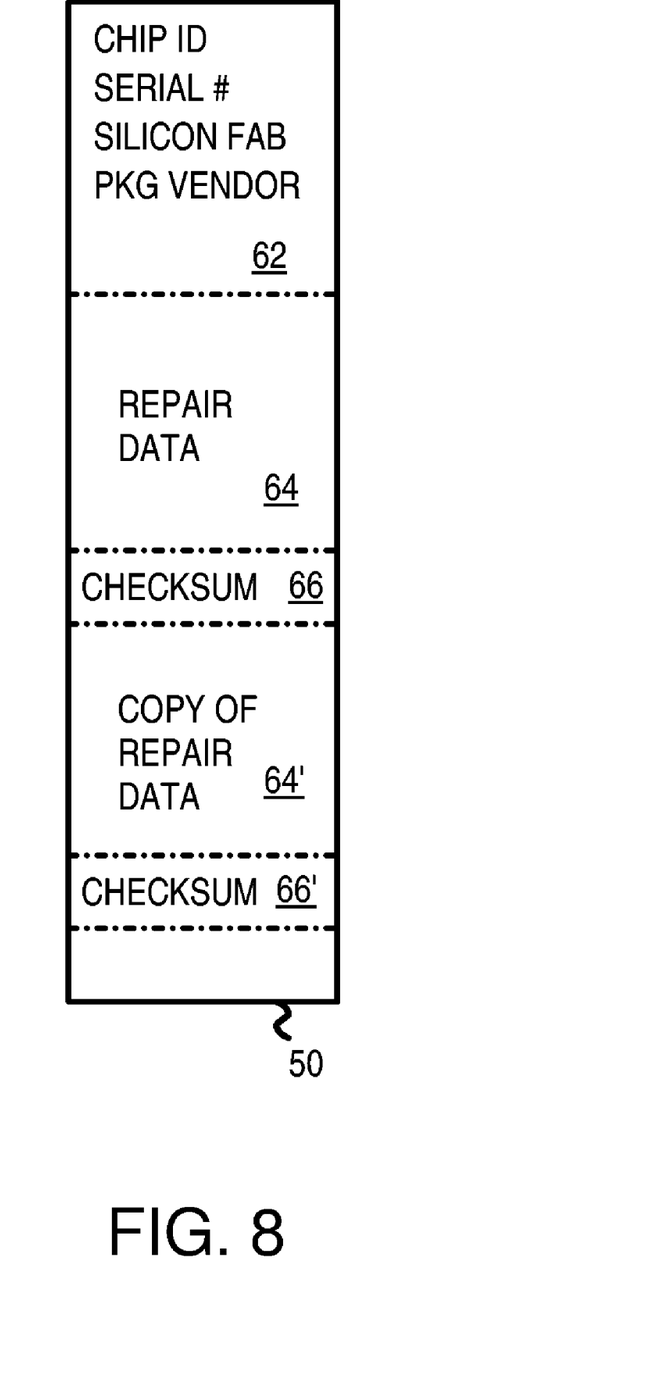
FIG. 8 is a diagram of the repair image stored in the EEPROM die.

FIG. 8 is a diagram of the repair image stored in the EEPROM die. While EEPROM die 50 and volatile repair RAM 38 could each store just one copy of the repair image, and no other data, it may be beneficial to store a backup copy of the repair image in the EEPROM die.

The non-volatile memory in EEPROM die 50 may have some initial data in header 62. This data may include a chip identifier or part number, a serial number for the dual-chip package, an number or name of the silicon fab that made the wafer of EEPROM dice, a vendor that packaged the dice into the dual-chip package, and other information. A variety of information could be stored in header 62. Header 62 could also appear after the repair images rather than before. Multiple copies of Header 62 may also be included for redundancy.

A first copy of repair image 36 is stored as repair data 64. First checksum 66 is a checksum generated from repair data 64 and also may or may not be generated using the header information. A checksum is useful to determine when an error has occurred, either in storing or in reading the data. The repair data could be re-read to embedded memory die when the checksum does not match a generated checksum that the embedded memory die generates from reading of repair data 64. Alternately, second copy repair data 64' could be read, and second checksum 66' compared to a generated checksum.

Rather than store checksums, parity or other check or integrity-verifying information could be stored. Errors in repair data 64 could be corrected if checksums were replaced by error-correction code (ECC) and correction routines were available. Volatile repair RAM 38 in embedded memory die 40 could also store all the information in EEPROM die 50, including both copies of the repair data, or could store just one copy of the repair data.

Figure 9A:
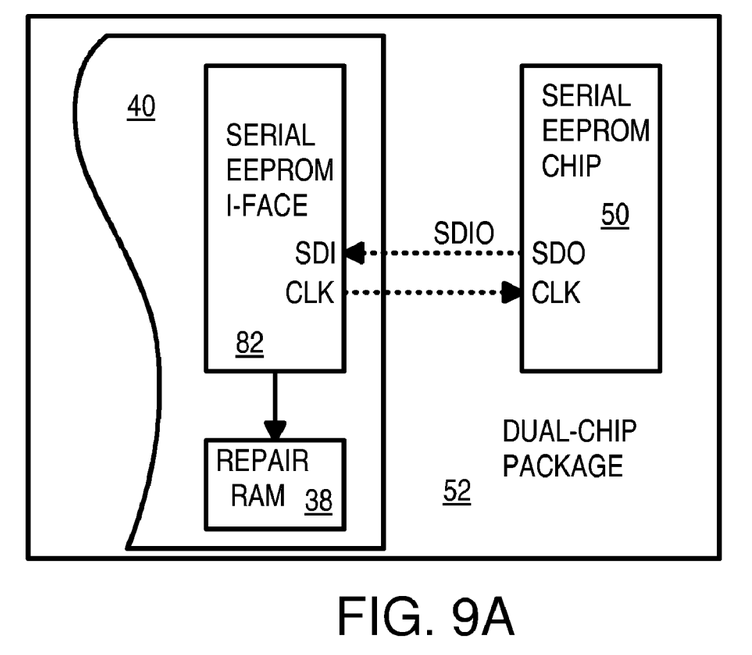
FIGS. 9A–9C show various ways to transfer the repair image from the EEPROM die to the embedded memory die in the dual-chip package.
Figure 9B:
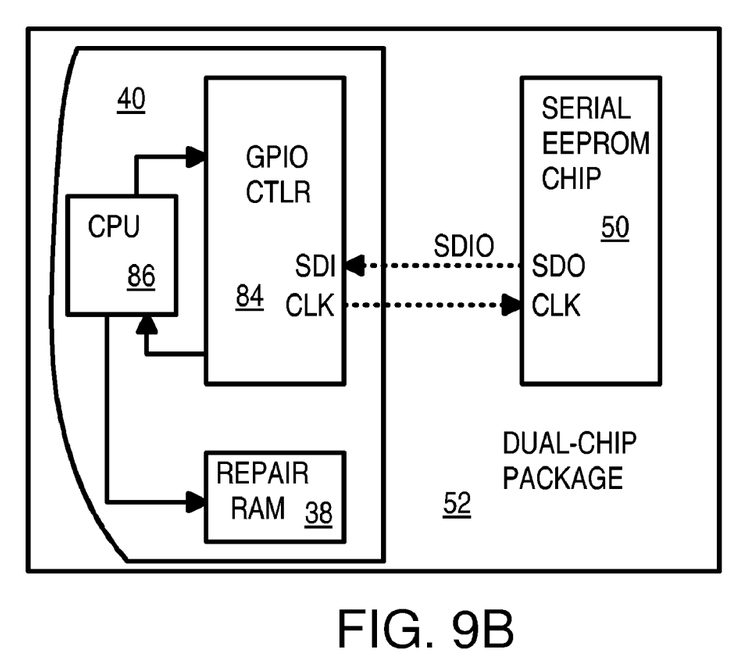
Figure 9C:
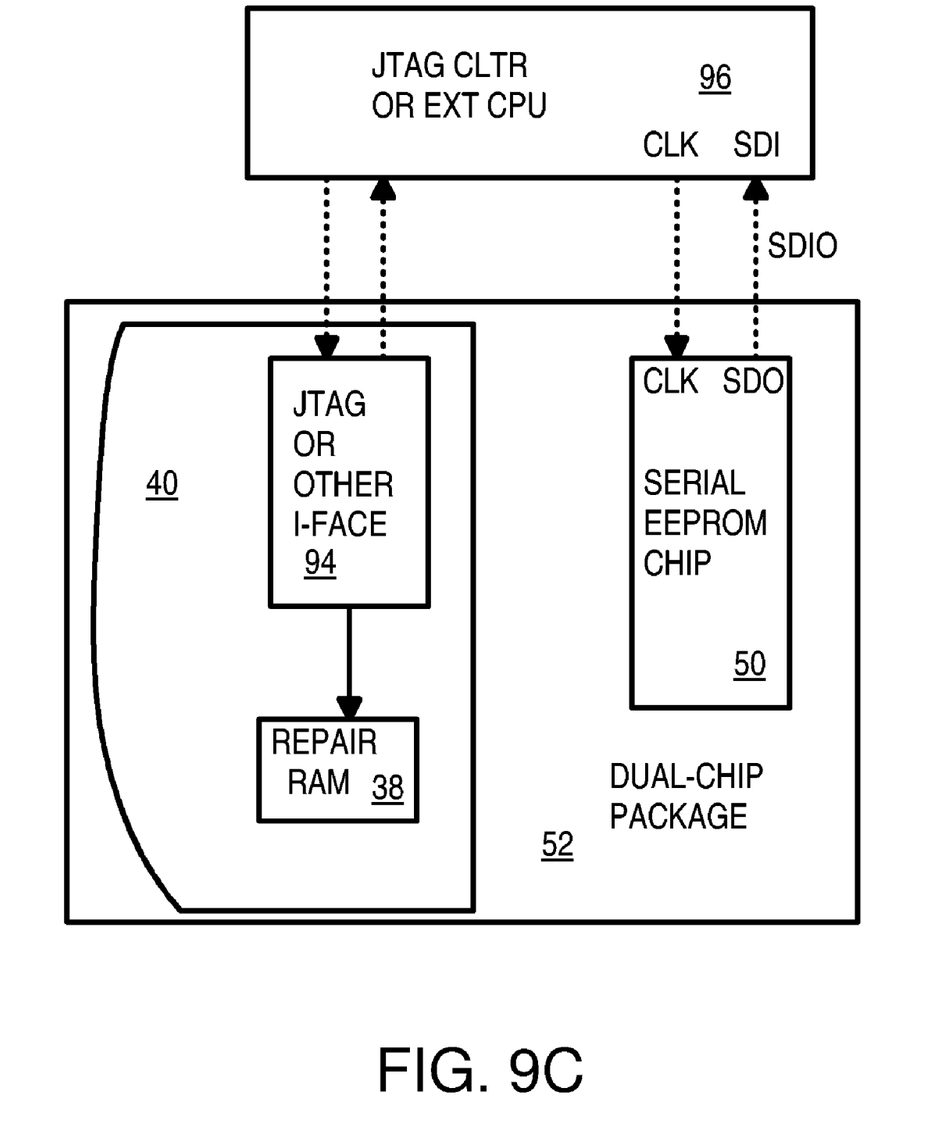

FIGS. 9A–C show various ways to transfer the repair image from the EEPROM die to the embedded memory die in the dual-chip package. FIG. 9A shows using a serial-EEPROM interface on the embedded memory die to transfer the repair image. Serial EEPROM die 50 has a serial interface that includes a serial data output SDO and a serial clock CLK that clocks transfer of serial data over line SDIO. Serial interface 82 is logic on embedded memory die 40 that generates the serial clock CLK and reads the serial data from EEPROM die 50 on serial input SDI connected to serial-data line SDIO.

The serial data is loaded into a register to convert it to parallel data and then copied to volatile repair RAM 38. Address pointers can be used to generated addresses to volatile repair RAM 38.

The serial data line SDIO can be a direct bonding wire from the SDI pad of embedded memory die 40 to the SDO pad of EEPROM die 50. Alternately, two bonding wires could be used, one from the SDI pad of embedded memory die 40 to a shared lead-frame extension, and another from the SDO pad of EEPROM die 50 to the same shared lead-frame extension. The serial clock could similarly be connected directly or through another shared lead-frame extension. Another alternative is to not use shared lead-frame extensions. Instead SDI and SDO connect to separate external pins 80, which are then connected together on a printed-circuit board (PCB).

FIG. 9B shows using a general-purpose input-output (GPIO) controller to transfer serial data. Embedded memory die 40 may be a complex system-on-a-chip, with central processing unit CPU 86 on the same die as embedded memory array 10. CPU 86 may be able to control various controllers on embedded memory die 40 and transfer data, such as using internal buses or direct-memory access (DMA) controllers.

CPU 86 executes an initialization routine that activates GPIO controller 84 during repair setup. GPIO controller 84 then generates the serial clock to EEPROM die 50 and reads the serial data on input SDI. CPU 86 transfers the repair data from GPIO controller 84 to volatile repair RAM 38 over internal buses after one or more bytes of repair data is received. GPIO controller 84 may be a programmable controller that is used by CPU 86 for other IO functions in a system during normal operation.

FIG. 9C shows a third embodiment using an external CPU or test-scan controllers to transfer the repair data. In this embodiment, EEPROM die 50 is not directly connected to embedded memory die 40, even though they are both packaged together in the same dual-chip package 52.

An external CPU or boundary-scan or other test controller, such as a Joint Test Action Group (JTAG) controller may be used to transfer the repair image. External CPU 96 generates the serial clock to EEPROM die 50 and reads the serial data from the SDIO serial line. The serial data of the repair image from EEPROM die 50 is sent from external CPU 96 to interface 94 on embedded memory die 40, either as serial or as parallel data. Interface 94 could be a JTAG interface when external CPU 96 is a JTAG controller, or could be some other kind of interface. The repair image received by interface 94 is written into volatile repair RAM 38, and repair controller 42 (not shown) in activated to enable remapping of faulty memory rows (or columns) to redundant rows (or columns).

ALTERNATE EMBODIMENTS

Several other embodiments are contemplated by the inventors. For example a variety of functional blocks, controllers, memories, data paths, etc. can be integrated on the embedded memory die. While an on-chip CPU, controller, DMA, and external CPU and test interfaces have been described to transfer the repair image, a variety of ways and combinations may be used, including various combinations of hardware, software, and firmware.

The embedded memory array may be divided into several separate arrays, or may be one or more sections within a larger array. The redundant rows and redundant columns could be located near each memory array, or could be consolidated into one or more areas. A variety of volatile memory cell technologies may be used in the embedded memory array, such as dynamic-random-access memory (DRAM), static random-access memory (SRAM), and dual-port or multi-port memory cells. The interface to the EEPROM may be serial or may be parallel or may have some other format and use various protocols such as packet protocols. The BIST engine may perform more complex actions including multiple passes of writes and reads and back-to-back (sequential) writes without reads in-between.

A wide variety of packaging technologies may be used for dual-chip package 52, including J-lead, surface-mount, Ball Grid Array (BGA), and flip-chip packages. Plastic, ceramic and other materials may be used. Tape-automated bonding (TAB) and other techniques may be used. Lead frames may be substituted with other frames or leads to the external pins. Additional dice may be packaged together in the multi-chip package, and other components such as capacitors may be included in the package. The external tester may be different machines and types of testers at different steps, such as at wafer sort and at final test. The chip pins may be solderable leads of various forms, or may be leadless pads or Ball Grid Array (BGA) solder balls, or some other IC connector.

The repair map may be a 2-dimensional map, or may have x,y or row, column coordinates of defects, or it may be in some other format such as a 1-dimensional format that identifies defective rows or defective columns. Defective groups or subsets of rows could also be identified, or the repair-map information may be encoded or compressed and have to be decoded or decompressed to locate which rows or columns to swap with the redundant elements. Only rows or only columns could be re-mapable, or blocks of many rows and/or many columns could be replaceable. Combinations of the above could also be used.

The repair data or repair image stored within the EEPROM die does not have to exactly match the repair data transferred to the embedded memory die, or the repair data stored in the volatile repair RAM. Various changes to the data and its format or encoding may take place with any transfers. For example, data may be inverted for storage in the EEPROM die or may be compressed and later de-compressed by the repair controller or other logic, either before storage in the volatile repair RAM or after storage in the volatile repair RAM. However, the repair data indicates locations of redundant elements or defects, regardless of format. The repair or redundant element locations may have different granularities and still be useful for repair.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A packaged system with a repairable embedded memory comprising:
    a multi-chip package having external pins for connecting to an external printed-circuit board (PCB);
    an embedded memory die packaged within the multi-chip package and electrically connected to a first subset of the external pins;
    an embedded memory array on the embedded memory die, the embedded memory array losing data when power is removed from the packaged system;
    a non-volatile memory die packaged within the multi-chip package and electrically connected to a second subset of the external pins;
    a persistent repair memory within the non-volatile memory die, the persistent repair memory retaining repair data when power is removed from the packaged system;
    a volatile repair memory within the embedded memory die, the volatile repair memory receiving repair data originally stored in the persistent repair memory after power-up, but the volatile repair memory losing the repair data when power is removed from the packaged system; and
    a repair controller, coupled to read and use the repair data from the volatile repair memory to repair defective memory locations within the embedded memory array,
    whereby defective memory locations in the embedded memory die are repaired using repair data stored in the persistent repair memory that is packaged in a same multi-chip package with the embedded memory die.

2. The packaged system of claim 1 further comprising:
    redundant elements for the embedded memory array, the redundant elements for replacing defective elements of the embedded memory array in response to the repair controller and dependent on the repair data read from the volatile repair memory.

3. The packaged system of claim 2 wherein the embedded memory array is not directly accessible from the external pins during a normal operating mode of the packaged system.

4. The packaged system of claim 3 wherein the persistent repair memory stores a repair image containing all repair data needed by the repair controller to repair the embedded memory array.

5. The packaged system of claim 4 wherein the volatile repair memory stores a repair image containing all repair data needed by the repair controller to repair the embedded memory array, or the volatile repair memory is a buffer that stores only a portion of the repair image.

6. The packaged system of claim 4 wherein the repair image contains identifiers that identify areas within the embedded memory array for replacement with the redundant elements.

7. The packaged system of claim 6 wherein the redundant elements are redundant rows or are redundant columns or include both redundant rows and redundant columns;
    wherein the identifiers identify rows or columns within the embedded memory array for replacement with the redundant elements.

8. The packaged system of claim 3 wherein the non-volatile memory die has a serial-data interface that transfers the repair data serially;
    whereby the non-volatile memory die is a serial memory.

9. The packaged system of claim 3 wherein the non-volatile memory die has electrically-erasable programmable read-only memory (EEPROM), and the embedded memory array is a static random-access memory (SRAM) or a dynamic-random-access memory (DRAM).

10. The packaged system of claim 4 further comprising:
    a built-in self-test (BIST) controller in the embedded memory die, the BIST controller activated to test the embedded memory array to identify defective memory locations.

11. The packaged system of claim 10 wherein the BIST controller directly generates the repair image that is stored in the persistent repair memory from the defective memory locations,
    or the BIST controller generates and outputs test results that indicate the defective memory locations and an external tester converts the test results into the repair image stored in the persistent repair memory.

12. The packaged system of claim 11 wherein the BIST controller further comprises:
    a pattern generator that generates a test sequence of test-data patterns during a test mode, the BIST controller writing the test sequence to memory locations within the embedded memory array during a write phase of the test mode; and
    a comparator that compares data read from the embedded memory array by the BIST controller during a read phase of the test mode to the test sequence from the pattern generator, the comparator signaling a defective memory location when a mis-match is detected by the comparator.

13. The packaged system of claim 4 wherein the persistent repair memory stores multiple copies of the repair image.

14. The packaged system of claim 13 wherein the persistent repair memory stores a checksum or redundant-check of the repair image.

15. The packaged system of claim 14 wherein the persistent repair memory stores a unique serial number of the packaged system with the repair image;
    wherein the unique serial number is different for every instance of the packaged system.

16. A repairable semiconductor device comprising:
    an embedded memory die having logic and an embedded memory that loses data when power is removed;
    a non-volatile memory die having a non-volatile memory that retains repair data when power is removed;
    multi-chip package means for encapsulating the embedded memory die together with the non-volatile memory die in a single package;
    redundant memory means for replacing faulty memory locations in the embedded memory;
    repair controller means, receiving repair data, for mapping addresses to the embedded memory for faulty memory locations to the redundant memory means, wherein mapping addresses is in response to the repair data; and
    built-in self-test (BIST) means, activated during a test mode, for generating addresses and test data for storage in the embedded memory, and for comparing test data stored in the embedded memory to expected test data to identify the faulty memory locations;
    wherein the repair data stored in the non-volatile memory die is generated in response to the faulty memory locations identified by the BIST means and is transferred from the non-volatile memory die to the repair controller means in the embedded memory die after power-up, whereby repair data is stored in the non-volatile memory die for repairing the embedded memory die that are packaged together in the multi-chip package means.

17. The repairable semiconductor device of claim 16 further comprising:

transfer means, in the embedded memory die, for receiving the repair data stored in the non-volatile memory die;

wherein the transfer means is selected from the group consisting of:

a serial-memory interface on the embedded memory die that has an input electrically connected within the multi-chip package means to an output of the non-volatile memory die;

a general-purpose input-output controller, activated by an internal processor on the embedded memory die, the general-purpose input-output controller having an input electrically connected within the multi-chip package means to an output of the non-volatile memory die;

a Joint Test Action Group (JTAG) interface to an external JTAG controller that is external to the multi-chip package means; and an external interface to an external processor, the external processor being external to the multi-chip package means.

* * * * *